United States Patent
Gordon et al.

(10) Patent No.: US 6,657,571 B2
(45) Date of Patent: *Dec. 2, 2003

(54) DATA ACQUISITION SYSTEM USING DELTA-SIGMA ANALOG-TO-DIGITAL SIGNAL CONVERTERS

(75) Inventors: Bernard M. Gordon, Manchester-by-the-Sea, MA (US); Hans Weedon, Salem, MA (US); Louis R. Poulo, Andover, MA (US); Mark H. Miller, Gloucester, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/874,769

(22) Filed: Jun. 5, 2001

(65) Prior Publication Data

US 2001/0043153 A1 Nov. 22, 2001

Related U.S. Application Data

(63) Continuation of application No. 09/243,708, filed on Feb. 3, 1999, now Pat. No. 6,252,531, which is a continuation of application No. 08/839,068, filed on Apr. 23, 1997, now abandoned, which is a continuation of application No. 08/712,137, filed on Sep. 11, 1996, now abandoned, which is a continuation of application No. 08/326,276, filed on Oct. 20, 1994, now abandoned.

(51) Int. Cl.[7] .............................................. H03M 3/00
(52) U.S. Cl. ...................................... 341/143; 341/155
(58) Field of Search .............................. 341/143, 155, 341/162, 163; 364/413.15

(56) References Cited

U.S. PATENT DOCUMENTS

| | | | |
|---|---|---|---|
| 4,547,893 A | 10/1985 | Gordon | 378/19 |
| 5,053,770 A | 10/1991 | Mayer et al. | 341/118 |
| 5,138,552 A | 8/1992 | Weedon et al. | 364/413.05 |
| 5,142,286 A | 8/1992 | Ribner et al. | 341/143 |
| 5,187,482 A | 2/1993 | Tiemann et al. | 341/143 |
| 5,257,026 A | 10/1993 | Thompson et al. | 341/118 |
| 5,274,375 A | 12/1993 | Thompson | 341/143 |
| 5,392,043 A * | 2/1995 | Ribner | 341/143 |

* cited by examiner

*Primary Examiner*—Peguy JeanPierre
(74) *Attorney, Agent, or Firm*—McDermott, Will & Emery

(57) ABSTRACT

A delta-sigma A/D converter includes a delta-sigma modulator having an integrating amplifier dispose within the loop of the modulator so that the input of the modulator can be connected to receive relatively low level input currents, and so as to improve DC stability. The modulator is specifically adapted for IC implementation for use in a DAS of a CT scanner so that the current output of a detector of the scanner can be connected directly to the input of the modulator of the converter. The noise shaping characteristics are shaped so as to provide an improved frequency response with minimal spillover. Noise shaping of the converter is provided throughout the dynamic range of the current outputs of CT scanner detectors so as to compensate for the poorer S/N for low input currents. The preferred converter also includes a unique digital filter transfer function, with finite impulse response (FIR) filter characteristics, optimized for CT-DAS applications and having excellent characteristics in the frequency domain and the time domain.

21 Claims, 9 Drawing Sheets

DATA ACQUISITION SYSTEM USING DELTA-SIGMA ANALOG-TO-DIGITAL SIGNAL CONVERTERS

CROSS REFERENCE TO RELATED APPLICATIONS

The following is a continuation application of U.S. patent application Ser. No. 09/243,708, filed on Feb. 3, 1999 now U.S. Pat. No. 6,252,531 issued Jun. 26, 2001, which in turn is a continuation application of U.S. patent application Ser. No. 08/839,068, filed on Apr. 23, 1997 now abandoned; which in turn is a continuation application of U.S. patent application Ser. No. 08/712,137, filed on Sep. 11, 1996 now abandoned, which in turn is a continuation application of U.S. patent application Ser. No. 08/326,276, filed on Oct. 20, 1999 now abandoned.

The present application is related to U.S. application Ser. No. 870,059, filed Apr. 17, 1992 in the name of Charles D. Thompson, and issued Dec. 28, 1993 as U.S. Pat. No. 5,274,375; and U.S. application Ser. No. 870,270, filed Apr. 17, 1992 in the names of Charles D. Thompson, Salvador R. Bernadas, Nicholas R. van Bavel and Eric J. Swanson, and issued Oct. 26, 1993 as U.S. Pat. No. 5,257,026.

FIELD OF THE INVENTION

The present invention relates generally to a data acquisition system (DAS), and more particularly, to a data acquisition system using oversampled, delta-sigma analog-to-digital (A/D) converters specifically adapted for use in computed tomography (CT) scanners.

BACKGROUND OF THE INVENTION

Certain signal processing techniques involve the simultaneous detection of a plurality of analog information signals for the purpose of acquiring data represented by the signals. For example, certain commercially available medical imaging systems such as CT scanners are used to image internal features of an object under view by exposing the object to a preselected amount and type of radiation. Detectors sense radiation from the object and generate analog signals representative of internal features of the object.

In the example of CT scanners, those of the third generation type include an X-ray source and X-ray detector system secured respectively on diametrically opposite sides of an annular-shaped disk. The latter is rotatably mounted within a gantry support so that during a scan the disk continuously rotates about a rotation axis while X-rays pass from the source through an object positioned within the opening of the disk to the detector system.

The detector system typically includes an array of detectors disposed as a single row in the shape of an arc of a circle having a center of curvature at the point, referred to as the "focal spot," where the radiation emanates from the X-ray source. The X-ray source and array of detectors are all positioned so that the X-ray paths between the source and each detector all lie in the same plane, referred to as the "slice plane" or "scanning plane", normal to the rotation axis of the disk. The X-rays that are detected by a single detector at a measuring instant during a scan is considered a "ray." Because the ray paths originate from substantially a point source and extend at different angles to the detectors, the ray paths resemble a fan, and thus the term "fan" beam is frequently used to describe all of the ray paths at any one instant of time. The ray is partially attenuated by all the mass in its path so as to generate a single intensity measurement as a function of the attenuation, and thus the density of the mass in that path. Projection views, i.e., the X-ray intensity measurements, are typically done at each of a plurality of angular positions of the disk.

In fourth generation CT scanners the detection system comprises a circular array of detectors secured on and at equiangular positions around the gantry support, equidistant from the rotation center of the disk so that the source rotates relative to the detectors. A fan beam is defined as the ray paths from the rotating source to each detector where the point of convergence of each fan beam is the corresponding detector.

The detectors used in CT scanners are usually either of the solid state type, such as cadmium tungstate detectors each having a scintillation crystal or layer of ceramic material and a photodiode, or of the gas type, such as Xenon detectors. The X-ray source can provide a continuous wave or a pulsed X-ray beam.

An image reconstructed from data acquired at all of the projection angles during a scan of both types of machines will be a slice along the scanning plane through the object being scanned. In order to "reconstruct" or "back project" a density image of the section or "slice" of the object in the defined scanning plane, the image is typically reconstructed in a pixel array, wherein each pixel in the array is attributed a value representative of the attenuation of all of the rays that pass through its corresponding position in the scanning plane during a scan. As the source and detectors rotate around the object, rays penetrate the object from different directions, or projection angles, passing through different combinations of pixel locations. The density distribution of the object in the slice plane is mathematically generated from these measurements, and the brightness value of each pixel is set to represent that distribution. The result is an array of pixels of differing values which represents a density image of the slice plane.

While the signals generated by the detectors through the series of readings provide the required data to generate the 2-dimensional image, acquiring and processing the data can pose various design problems. For example, a large number of detectors must be used for each set of readings taken for each projection view, and a large number of projection views must be taken during a scan in order to create a detailed image with sufficient resolution (a typical third generation CT scanner contains on the order of 350 to 1000 detectors, with, for example, 600 to 3000 projection views being taken within a period of 2 seconds resulting in data values, i.e., detector readings, on the order of one million, although these numbers can clearly vary). The resolution of the image created can be improved by increasing the number of detectors used and/or sets of readings, i.e., projection views, utilized. This increases the amount of data acquired and, therefore, the amount of signal information that must be processed. Accordingly, with over approximately one million data values acquired during a typical CT scan the analog signals acquired in each set of readings or views must be quickly and efficiently digitized so that computer processing can be utilized to provide relatively fast results.

Thus, in order to process the data received from the array of detectors, a data acquisition system (DAS) is used to process the data through multiple channels substantially all at the same time. The DAS includes means for converting the plurality of sets of data received from the detectors as analog signals during each projection view into corresponding digital signals so that the latter can be processed by a digital signal processor (DSP). However, various problems exist with respect to current DAS designs. For example, many DASs required for CT scanning require high digitization resolution on the order of one million ($10^6$) to one or better, i.e., 20 bits or more. While many A/D converter techniques are known, some, such as successive approximation A/D conversion, provide inadequate signal resolution and therefore are incapable of achieving a digital signal of 20 bits or more. In this regard A/D converters using integrators have been designed to provide the required high resolution.

Where DASs are used with a continuous wave X-ray source, any modulation in the X-ray source during a scan over time will create errors. Problems are also encountered when the DAS is used with a pulse X-ray source. For example, artifacts due to variable afterglow readings of X-ray pulses are not necessarily treated identically for all of the channels. These interpulse values have an overall effect on the values of the detected analog signals corresponding to the detected X-rays in response to the pulses of X-rays from the source, and the interpulse values should be taken into consideration to provide accurate readings. In addition current leakage of certain storage devices, disposed in each channel, for storing temporarily stored information can create errors in the signal conversion.

While some of these problems can be overcome by using a separate A/D converter for each channel, until recently such an approach has been impractical because of its prohibitive cost. With the dynamic range of the analog signals provided in each channel on the order of $10^6$ to 1, a linear ramp A/D converter is also impractical. One DAS which overcomes or at least minimizes many of the above problems is described in U.S. Pat. No. 5,138,552, patented in the name of Hans J. Weedon and Enrico Dolazza, issued Aug. 11, 1992 and assigned to the present assignee (the "Weedon et al. Patent). The latter patent describes a DAS using non-linear digitization intervals by employing a non-linear ramp A/D converter.

In addition, CT scanners use detectors providing low level output currents. In general solid state detectors each include a layer of scintillator crystal or ceramic material for generating low energy photons as a function of high energy photons received from the X-ray source. A photodiode is provided with each scintillator crystal for generating a current as a function of the low energy photons emitted by and detected from the corresponding scintillator crystal or ceramic material. Since the photodiodes provide a low level current, a preamplifier, in the form of a transimpedance amplifier, is typically provided to convert the current to a voltage at an appropriate level so that it can be converted to a digital signal. In fact in some CT scanners using gas detectors, similar transimpedance amplifiers are utilized for the same reasons. Analog filtering of the output of each transimpedance preamplifier, prior to A/D conversion, is carried out to suppress the out-of-band portions of the wideband noise originating within the preamplifiers and the photodiodes that precede them. Doing this filtering before A/D conversion reduces the noise generating an alias within the band of frequencies containing the information data during A/D conversion. Customarily, sample and hold circuitry is provided before each A/D converter to hold each successive sample throughout the time period needed to complete the A/D conversion.

In certain CT scanners the preamplifiers and filters are apportioned among subgroups of detectors and filters and the analog signal outputs of each subgroup of detectors and filters are analog multiplexed prior to being converted to a digital signal. But analog multiplexing creates difficulties in matching the conversion characteristics of the A/D converters for the various subgroups owing to the need for a very high number of bits of resolution in converter output signals in order to reconstruct the image. Differences in conversion characteristics can cause noticeable "banding artifacts" in the final image. The banding artifacts appear as intensity variations with the reconstructed image with considerable lower spatial frequency so that they are usually noticeable. Selecting photodiodes which are physically spaced from one another for each group can reduce these artifacts. However, this will increase the likelihood of high spatial frequency components of these artifacts appearing in the image. These high spatial frequency components may also be filtered with a low pass filter, if desired, with a loss of only of some high-spatial frequency detail in the final image.

Further, spaced apart detectors for each subgroup leads to complex interconnections complicating data transfer. In addition spaced apart detectors using a time multiplexed architecture increases the physical distance between some of the detectors and the respective preamplifiers, increasing the chances of pick-up of extraneous electrical signals as noise.

A DAS having high resolution that has been developed for CT scanners that overcomes or at least reduces the effects of these problems is a DAS using delta-sigma oversampled A/D converters, described in U.S. Pat. No. 5,142,286 issued in the names of David B. Ribner and Michael A. Wu for Read-out Photodiodes Using Delta-sigma Oversampled Analog-to-Digital Converters (the Ribner et al. Patent). The Ribner et al. Patent describes a high-resolution A/D signal converter using components commonly used to process audio signals for use in processing data from a CT scanner. Conversion is provided through the use of oversampled, interpolative (or delta-sigma) modulation followed by digital low-pass filtering, typically using an finite impulse response (FIR) filter, and then by decimation. "Oversampling" refers to operation of the modulator at a sampling rate many times above the signal Nyquist rate, whereas "decimation" refers to subsampling so as to reduce the sample rate to the Nyquist rate. The ratio R of the oversampling rate to the signal Nyquist rate is designated the "oversampling ratio". As described in the Ribner et al. Patent, delta-sigma A/D converters having single-bit quantizers in the overall feedback loops of their delta-sigma modulators can have very linear predictable conversion characteristics so that matching the conversion characteristics of a plurality of delta-sigma A/D converters can be easily accomplished by so designing them in the same way. This result makes it feasible to use such a converter with each photodiode and preamplifier combination of a CT scanner, without the need to time multiplex in the analog domain.

The design proposed in the Ribner et al. Patent, necessarily requires a separate transimpedance preamplifier for generating an analog output signal responsive to the photocurrent of the corresponding photodiode of the solid state detector. The analog output signal is accompanied by wideband noise. Each analog output signal is applied to an analog, anti-alias, lowpass filter, whose output is provided to the input of a corresponding delta-sigma A/D modulator of an A/D converter. The converter includes a data rate decimator and digital filter which suppresses quantization noise from the delta-sigma modulator portion of the A/D converter, as well as a component arising from remnant wideband noise from the preamplifier.

While the use of delta-sigma modulators for A/D conversion in a DAS, as proposed in the Ribner et al. Patent, provides certain advantages over the prior art A/D converters using integrators, the design proposed by the patentees has certain drawbacks. For example, there is currently great interest in decreasing the overall cost of CT scanners. The DAS significantly contributes to that cost. While the oversampling delta-sigma modulator and data rate decimator and digital filter as an A/D converter easily lend themselves to integration fabrication techniques, the transimpedance preamplifier and anti-alias low-pass filter do not. Currently, such analog circuitry would be expensive to fabricate as a part of an integrated chip set including the delta-sigma modulator, probably more expensive than using discrete components based upon current integration techniques. Providing a separate transimpedance preamplifier and analog filter for each detector in discrete form as the front end of each channel of a DAS, nevertheless adds significant cost to the DAS where, for example, the number of channels needed are on the order of 350 to 1000 channels. It is desirable therefore to simplify the front end of the DAS so that it can be made entirely as integrated circuitry so as to reduce the cost of the DAS.

In addition a design tradeoff exists between a DAS having a spectral response optimized for the frequency domain and a DAS optimized for the time domain. More particularly, when sequentially reading the output of a channel, it is clear that the reading during each sampling interval should be as independent as possible from the previous readings taken from that channel, as well as readings taken from the other channels. This effects the time domain properties of the A/D converter. Any "spill-over" or "cross talk" of a signal in the channel from a prior sampling interval (sometimes referred to as "view-to-view cross talk"), thus will have a negative effect on the time domain properties of the converter. On the other hand, the frequency response of the converter largely determines the signal-to-noise ratio (S/N) and thus the quality of the signal processed through the channel. The DAS using a low pass analog filter, such as a best estimate filter of the type described in U.S. Pat. No. 4,547,893 issued Oct. 15, 1985 to Bernard M. Gordon and assigned to the present assignee, for shaping the spectral response of the output of the transimpedance amplifier is optimized for its frequency domain characteristics, at the cost of some of its time-domain properties, with spillover of as much as 25% not being unusual (i.e., 25% of the signal is from previous readings in the channel). On the other hand, an integrator type analog filter, is optimized for its time-domain characteristics, since the integrator is cleared or nulled after each sampling interval, before the next sampling interval. This insures little or no spillover, however, at the cost of negatively impacting its frequency-domain properties with a substantial amount of high frequency noise being present.

In addition to the foregoing, electronic noise can be a significant problem in DASs used for CT scanners, particularly at low level detector signal levels. The design described in the Ribner et al. Patent uses a delta-sigma modulator and FIR digital filter. The noise levels of the design tend to remain substantially the same throughout the dynamic range of the input signal. Further, the noise level of X-ray flux is not substantially constant for all levels of flux, but instead is approximately proportional to the square root of the number of photons present. Thus, where the electronic noise of the circuit is substantially at a relatively fixed level, the S/N level of the analog signal provided in each information transmission channel (which is a function of both the noise level of the X-ray flux and the electronic noise), prior to digitization, tends to worsen as the signal gets smaller.

Finally, DC stability is of great concern in CT scanner DAS applications since drift of the detected signal can seriously effect the uniformity of channel to channel performance, and thus the quality of the image reconstructed from the data derived from the acquired signals.

OBJECTS OF THE INVENTION

It is therefore a general object of the present invention to reduce the costs of a DAS of the type using delta-sigma A/D conversion.

In is another object of the present invention to provide an improved DAS design of the type using delta-sigma A/D conversion and adapted to be easily implemented in integrated circuit form and responsive to low amplitude current inputs received from CT scanner detectors.

Another object of the present invention is to provide an improved DAS of the type using delta-sigma A/D converters without the need for analog signal time multiplexing.

And another object of the present invention is to provide an improved DAS of the type using delta-sigma converters and having an improved frequency response with nominal spillover.

Yet another object of the present invention is to provide an improved DAS of the type designed to provide unique noise shaping of the delta-sigma A/D converters throughout the dynamic range of the current outputs of CT scanner detectors so as to compensate for the poorer S/N for low X-ray photon levels.

Still another object of the present invention is to provide a DAS of the type using delta-sigma A/D converters having a unique digital filter transfer function, with finite impulse response (FIR) filter characteristics, optimized for CT-DAS applications and having excellent characteristics in the frequency domain and the time domain.

And yet another object of the present invention is to provide a best estimating, optimum, transient response filter which is an improvement over the filter design described in U.S. Pat. No. 4,547,893 issued to Gordon.

And still another object of the present invention is to provide an improved delta-sigma A/D converter for use in a DAS of a CT scanner having improved DC stability.

SUMMARY OF THE INVENTION

The invention relates to a delta-sigma A/D converter including a delta-sigma modulator having an integrating amplifier dispose within the loop of the modulator so that the input of the modulator can be connected to receive relatively low level input currents, and so as to improve DC stability. The modulator is specifically adapted for IC implementation for use in a DAS of a CT scanner so that the current output of a detector of the scanner can be connected directly to the input of the modulator of the converter. The noise shaping characteristics are shaped so as to provide an improved frequency response with minimal spillover. Noise shaping of the converter is provided throughout the dynamic range of the current outputs of CT scanner detectors so as to compensate partially for the poorer S/N for low input currents. The preferred converter also includes a unique digital filter transfer function, with finite impulse response (FIR) filter characteristics, optimized for CT-DAS applications and having excellent characteristics in the frequency domain and the time domain.

Other objects of the present invention will in part be obvious and will in part appear hereinafter. The invention accordingly comprises the apparatus possessing the construction, combination of elements and arrangement of parts exemplified in the following detailed disclosure and the scope of the application of which will be indicated in the claims.

BRIEF DESCRIPTION OF THE DRAWINGS

For a fuller understanding of the nature and objects of the present invention, reference should be had to the following detailed description taken in connection with the accompanying drawings wherein.

DETAILED DESCRIPTION OF THE DRAWINGS

Figure 1:
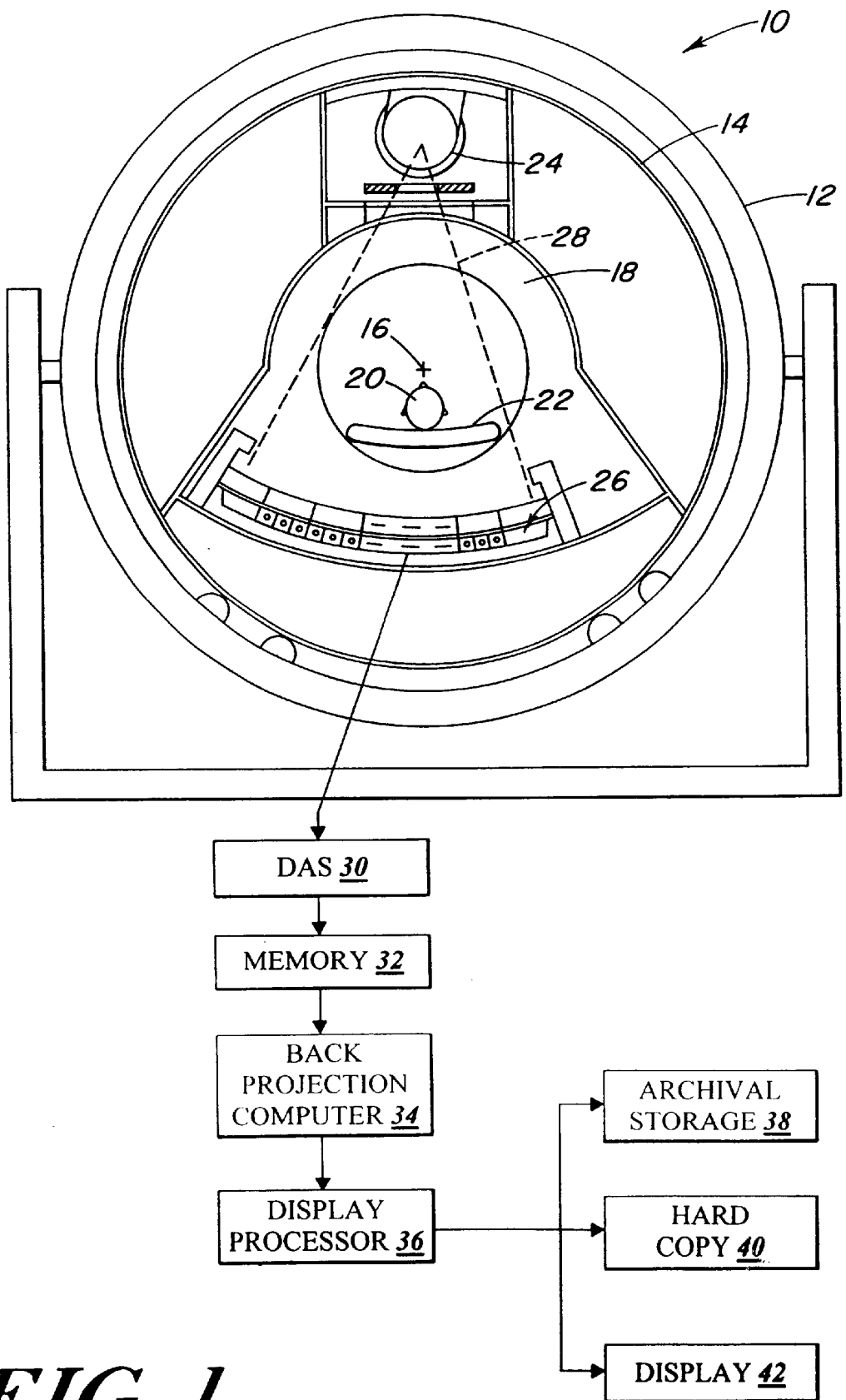
FIG. 1 is a diagram, partially in schematic and partially in block form, of a computerized tomography scanner of the third generation type, which can be designed to include the present invention.

FIG. 1 shows the essential elements of a CT scanner of the third generation type. The CT scanner 10 comprises a gantry including a gantry support frame 12 for rotatably supporting an annular disk 14 about a rotation axis indicated at 16. The disk 14 has an opening 18 for receiving the object 20 to be scanned, the object typically being supported on a pallet or cantilevered table, indicated at 22. The disk 14 supports an X-ray source 24 and detector array 26 on diametrically opposite sides of the opening 18. As seen the fan beam 28 created by the source 24 is directed toward the detector array 26. The detector array is connected to a DAS 30 for processing the data received from the detector array 26. The data is processed by DAS 30 and stored in memory 32. A back projection computer 34 is adapted to process the data in a manner which is well known using Radon mathematics so that the data can be provided to a display processor 36 for archival storage as indicated at 38, for providing a hard copy as indicated at 40, or for displaying on a console as indicated at 42.

Figure 2:
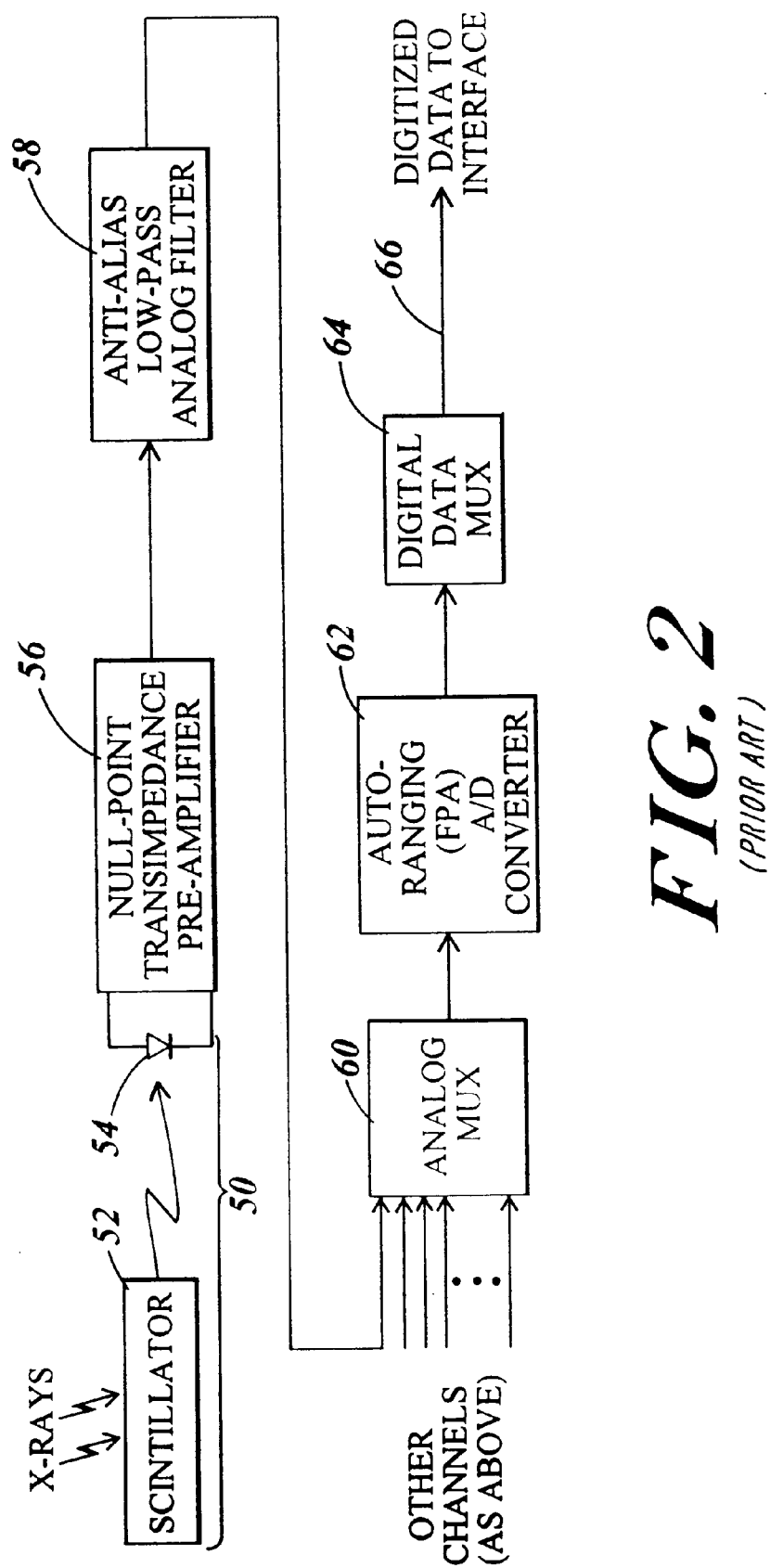
FIG. 2 is a block diagram of one channel of a prior art DAS of type employing time multiplexing, an anti-alias low-pass analog filter, and auto-ranging (or floating point amplifier) A/D conversion techniques.

One type of prior art DAS commonly used in a CT scanner of the type using solid state detectors is illustrated in FIG. 2. In typical CT scanners there are from about 350 to 1000 detectors (only one being shown in FIG. 2) producing an equal number of signals through an equal number of channels. As shown, a solid state detector 50 comprises (1) a scintillator crystal or ceramic 52 for emitting low energy photons in response to and as a function of the high energy photons emitted by the X-ray source of the CT scanner and detected by the crystal, and (2) a photodiode 54 for providing a current output as a function of and in response to the low energy photons detected from the crystal or ceramic material. Thus, the detector 50 provides a current output signal as a function of and responsive to the X-ray photons detected. The diode 54 is connected to a null-point transimpedance pre-amplifier 56 for converting the current output of the diode to a voltage at an appropriate level. The output of the pre-amplifier 56 is connected to the anti-aliasing, aliasing, low pass analog filter 58. The channels defined by the respective detectors 50, pre-amplifiers 56 and filter 58, through which the corresponding analog signals are transmitted, are divided into groups, with the channels of each group time sharing an A/D converter so as to reduce the overall cost of the DAS. The analog signals associated with each group are applied to the common A/D converter 62 through a time analog signal multiplexer 60 in a sequential manner so that all of the analog signals transmitted through the channels of a group can be independently converted by the common A/D converter 62. The converter is preferably of the type described as a floating point (or auto-ranging) A/D converter, which comprises both a floating point amplifier and an A/D converter and operates in a manner well known in the art. An example, of an auto- ranging A/D converter is described in U.S. Pat. No. 5,053,770 issued Oct. 1, 1991 in the names of Eliot Mayer, Louis R. Poulo, Jeffrey L. Sauer and Hans J. Weedon. Once converted, the signals are applied to a digital data multiplexer 64.

Figure 3:
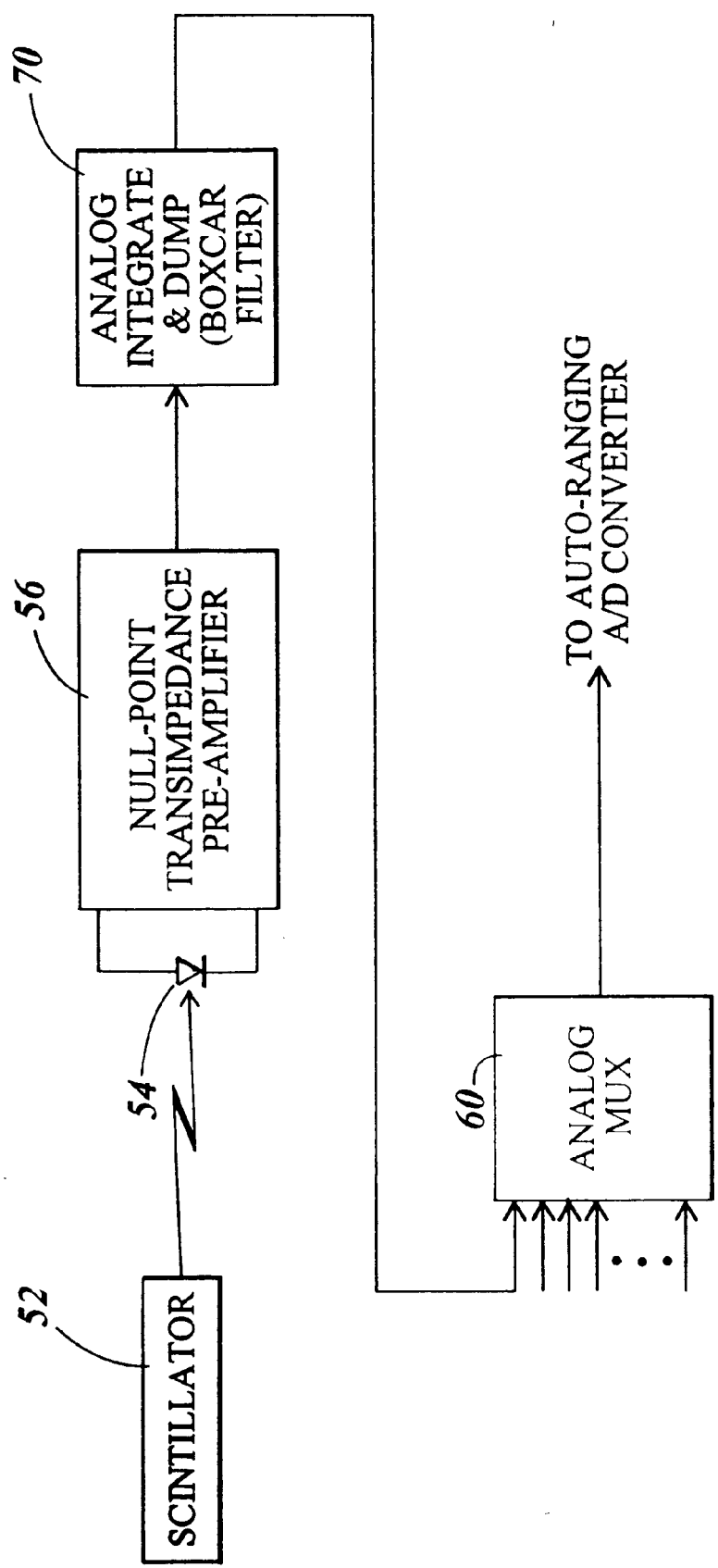
FIG. 3 is a block diagram of one channel of a prior art DAS of type employing time multiplexing, an analog integrate and dump (or "boxcar") filter, and auto-ranging (or floating point amplifier) A/D conversion techniques.

As shown in FIG. 3, an analog integrate and dump (or boxcar) filter 70 can be substituted in place of filter 58. Again a multiplexing arrangement is provided in order to reduce the number of A/D converters needed for processing the signals provided from all of the detectors.

Figure 8:
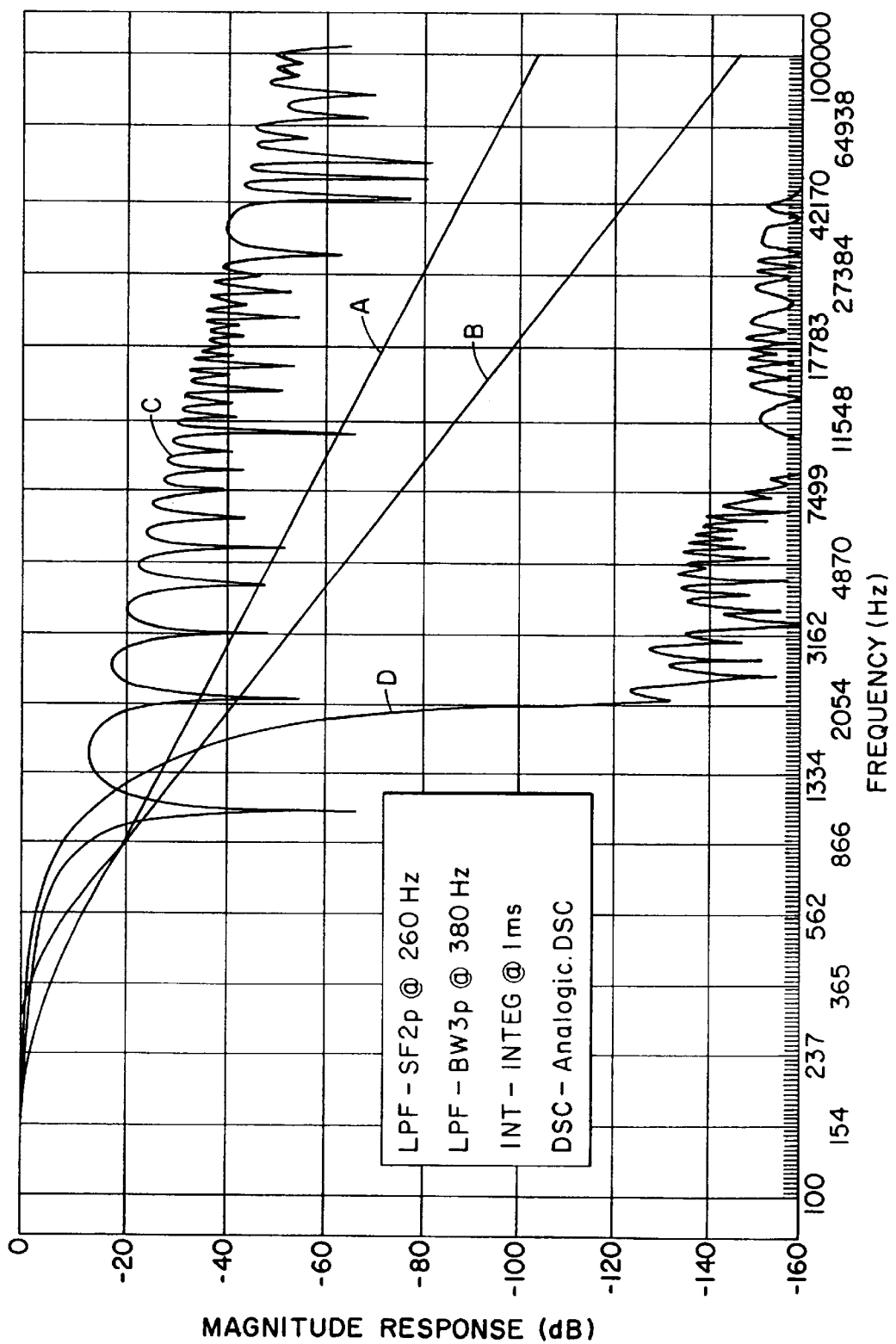
FIG. 8 is a graphical illustration of a comparison of two low pass analog filters, an integrating type filter and the spectral response of the digital FIR filter utilized in the preferred embodiment of the present invention shown in FIG. 6.

Using the analog signal time multiplex arrangement shown in FIG. 2 or FIG. 3, the signal conversion frequently is not identical for the signals processed through the different groups to the degree necessary to achieve the desired high resolution for a relatively large dynamic range. The variabilities among commonly used A/D converters can thus result in nonuniform readings. As described above, the low pass, analog filters 58 can be designed to provide a decent frequency response, but exhibit poor time domain response. For example, in FIG. 8 the frequency response of a low pass, analog two pole filter having a rolloff of −12 dB/octave beginning at the cut off frequency of 260 Hz is shown at A, while the frequency response of low pass, analog three pole filter having a rolloff of −18 dB/octave beginning at the cut off frequency of 380 Hz is shown at B. However, spillover of as much as 25% occurs with the use of these filters. Use of the analog integrate and dump or boxcar filter 70, as shown in FIG. 3, provides a better time domain response, e.g., a spillover on the order of less than 1%. But as shown in FIG. 8, curve C, the improvement in the time domain is at the expense of a poorer frequency response, where the effective rolloff of curve C as seen in FIG. 8 is much smaller than that achieved by the analog low pass filters represented by curves A and B.

The delta-sigma A/D converter design, described in the Ribner et al. Patent, provides an improvement over the DASs of the type described in connection with FIGS. 2 and 3, using analog, low pass filters and boxcar filters. A simplified block diagram of the delta-sigma A/D converter design is shown in block diagram form in FIG. 4. As shown the photodiode 54 of each detector 50 is connected to a null-point transimpedance pre-amplifier 56, which in turn is connected to an anti-aliasing low-pass analog filter 58, the identical arrangement provided in the FIG. 2 system.

Figure 4:
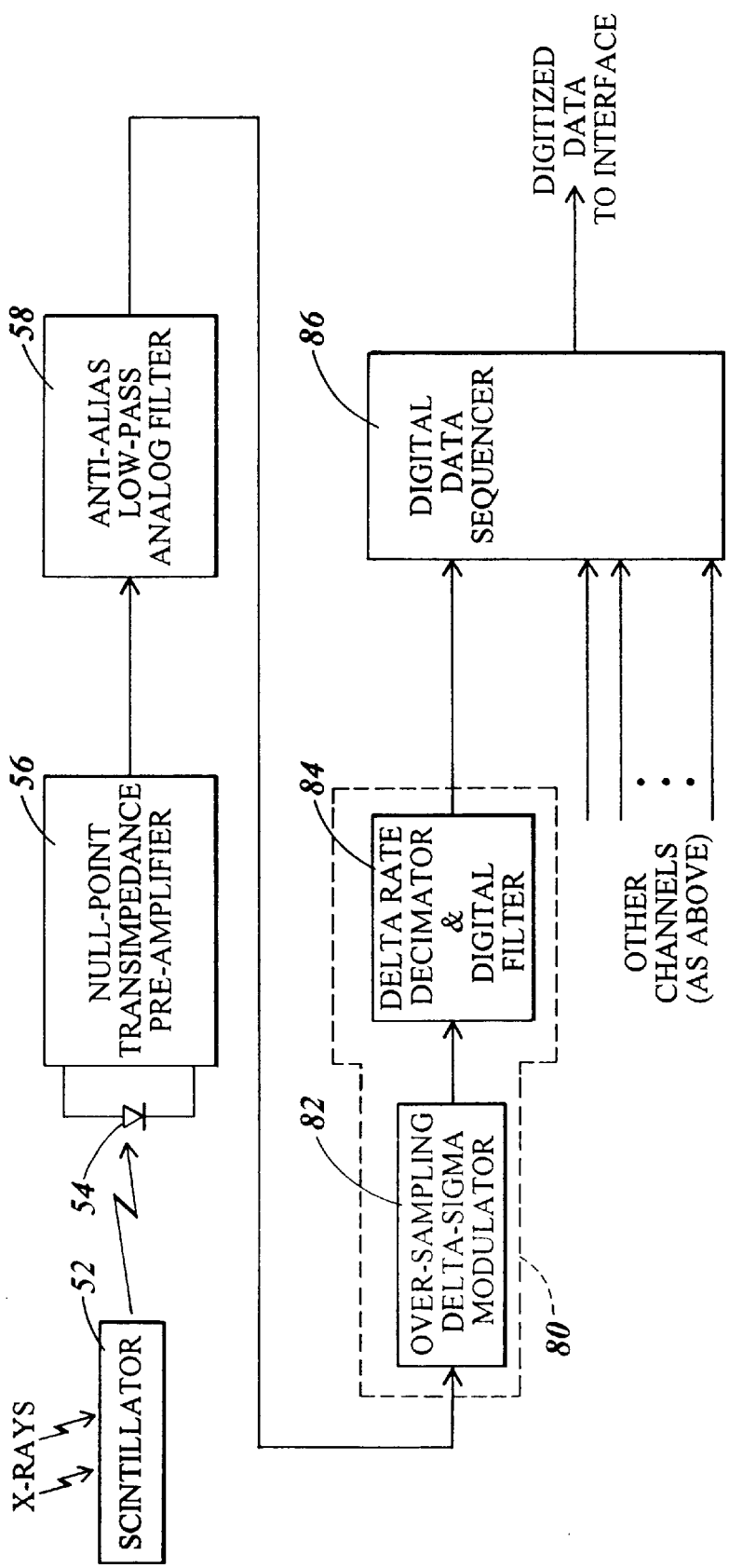
FIG. 4 is a block diagram of one channel of the prior art DAS of the type described in the Ribner et al. Patent.

However, the output of the filter 58 is connected to a delta-sigma A/D converter 80 comprising the oversampling, interpolative, delta-sigma modulator 82 and the data rate decimator and digital filter 84. Each channel is therefore defined by a detector 50, transimpedance amplifier 56, filter 58, modulator 82 and decimator filter 84, eliminating the need for an analog multiplexer since each channel has its own A/D conversion. In addition, the delta-sigma modulator 82 is designed to push much of the noise (dominated by quantization noise) into the higher frequencies and subsequently removed by the data rate decimator and digital filter 84. Each channel is connected to a digital data sequencer 86 for providing a sequencing of data to the interface with the storage device, and back projection computer shown in FIG. 1. While the arrangement provides a time sharing digital data sequencer 86, it should be evident that time sharing in the digital domain, where signals are either of one of two values is far less likely to lead to errors, than an analog signal time multiplexing system requiring the time sharing transmission of signals which are being measured within a dynamic range of approximately one million to one, where a quantization shift of analog signal (equal to one millionth of the full signal value) can introduce an error. In addition, the arrangement of FIG. 4 provides an improvement over the arrangements described with respect to FIGS. 2 and 3, since each delta-sigma converter 80, comprising the oversampling delta-sigma modulator 82 and the data rate decimator and digital filter 84, has single-bit quantizers in the overall feedback loops of its delta-sigma modulator 82 and therefore has very linear conversion characteristics. Matching the conversion characteristics of a plurality of delta-sigma A/D converters can be easily done by designing them to have the same single-bit quantizers in the overall feedback loops of their delta-sigma modulators. This result makes it feasible to use such a converter with each photodiode 54 and preamplifier 56 combination, without the need to time multiplex in the analog domain.

In addition, as described in the Ribner et al. Patent, two major factors determine the resolution of the delta-sigma A/D converters. One factor is the overall sampling ratio R, and the other factor is the "order" of the modulator. It is preferable to use a higher-order modulator in a CT scanner since the oversampling ratio R need not be quite so large; given that there are hardware limitations on how short the duration of a sampling interval can be made. Reducing the number of samples required for obtaining a specified bit resolution from the delta-sigma A/D conversion will reduce the time required to acquire the data of each projection view. However, "order" indicates the relative degree of spectral shaping that is provided by the delta-sigma modulator. Higher frequency selectivity is obtainable with a higher order modulator at the expense of increased hardware complexity, particularly in the decimation filter required to suppress quantization noise from the modulator. As described in the Ribner et al. Patent, one FIR digital filter design that is suited for use in the decimation filter of a delta-sigma modulator to form a frequency selectivity against quantization noise has a frequency response of $$\text{sinc}^{(L+1)}(\omega T), \quad (1)$$

wherein L is the order of the delta-sigma modulator,
ω is the radian frequency, and
T is the modulator period.

It is submitted, however, that the design described in the Ribner et al. Patent has its shortcomings. First, the use of the null-point transimpedance amplifier 56 and the analog filter 58 makes the design difficult to implement entirely in IC form. While the converter 80 and sequencer can be implemented in IC form, the front end comprising the pre-amplifier 56 and filter 58 cannot, due to the nature of those components. Thus, a DAS comprising 350 and 1000 channels requires 350 to 1000 front end discrete analog components to form the pre-amplifier and filter. This adds considerable costs to the DAS. In addition, typical delta-sigma modulators and decimators and filters were originally designed for processing audio signals where DC stability is of little concern and the S/N of the signal remains substantially the same through the dynamic range of the audio signal. However, as previously described DC stability is very important in processing data signals in a CT scanner, where DC drift can cause inaccuracies in the reconstructed image produced from the data. Further, while the S/N ratio of audio signals tends to remain the same throughout the dynamic range of the signal, the noise level of X-ray flux is not substantially constant for all levels of flux, but instead is approximately proportional to the square root of the number of photons present. Thus, where the electronic noise of the circuit is substantially at a relatively fixed level, the S/N level of the analog signal provided in each information transmission channel, prior to digitization, tends to worsen as the signal gets smaller.

Figure 5:
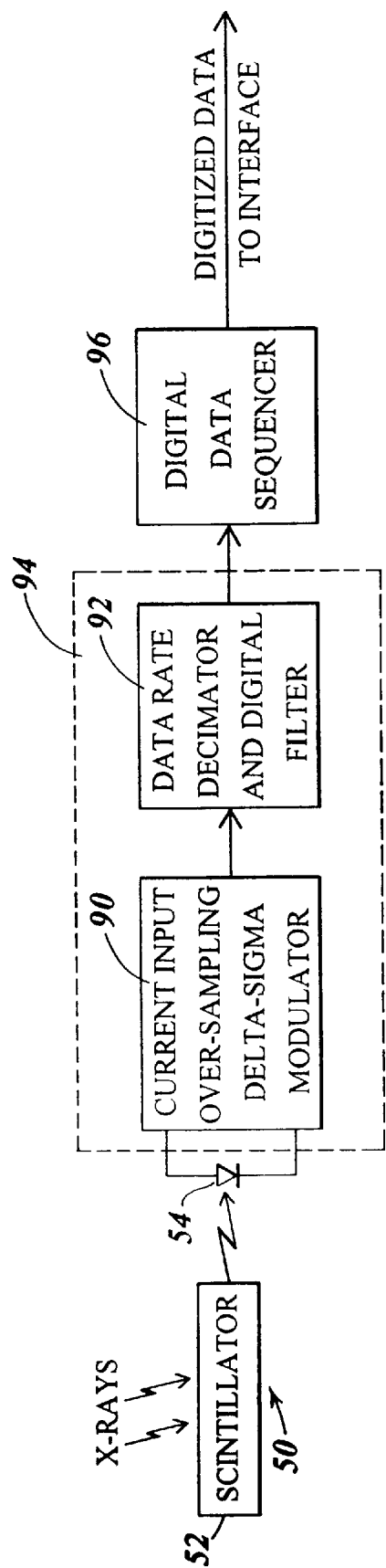
FIG. 5 is a block diagram of one channel of a the DAS designed in accordance with the present invention.

In accordance with the present invention the delta-sigma A/D converter is provided specifically for use in a DAS of a CT scanner, having greater DC stability, improved performance in both the frequency and time domain, and adapted to be implemented in IC form so as to reduce the cost of the DAS. As shown in FIG. 5, the current output of the diode 54 is applied directly to the input of the current input, oversampling delta-sigma modulator 90 of the delta-sigma A/D converter 94. The output of the modulator is applied to the data rate decimator and digital filter 92, for reducing the data rate to within the bandwidth of interest and for filtering out high frequency noise. The output of the filter 92 is applied to the digital data sequencer 96. As will be more evident hereinafter, by making the modulator 90 a current input device the design allows for the elimination of the input transimpedance pre-amplifier, designated 56 in FIG. 4. In addition, the anti-alias filter 58 of FIG. 4 can be eliminated as well by designing the noise shaping characteristics of the modulator 90 and the data rate decimator and digital filter 92 to provide improved results. Thus, the components that were heretofore required to be made as discrete components are eliminated.

Figure 6:
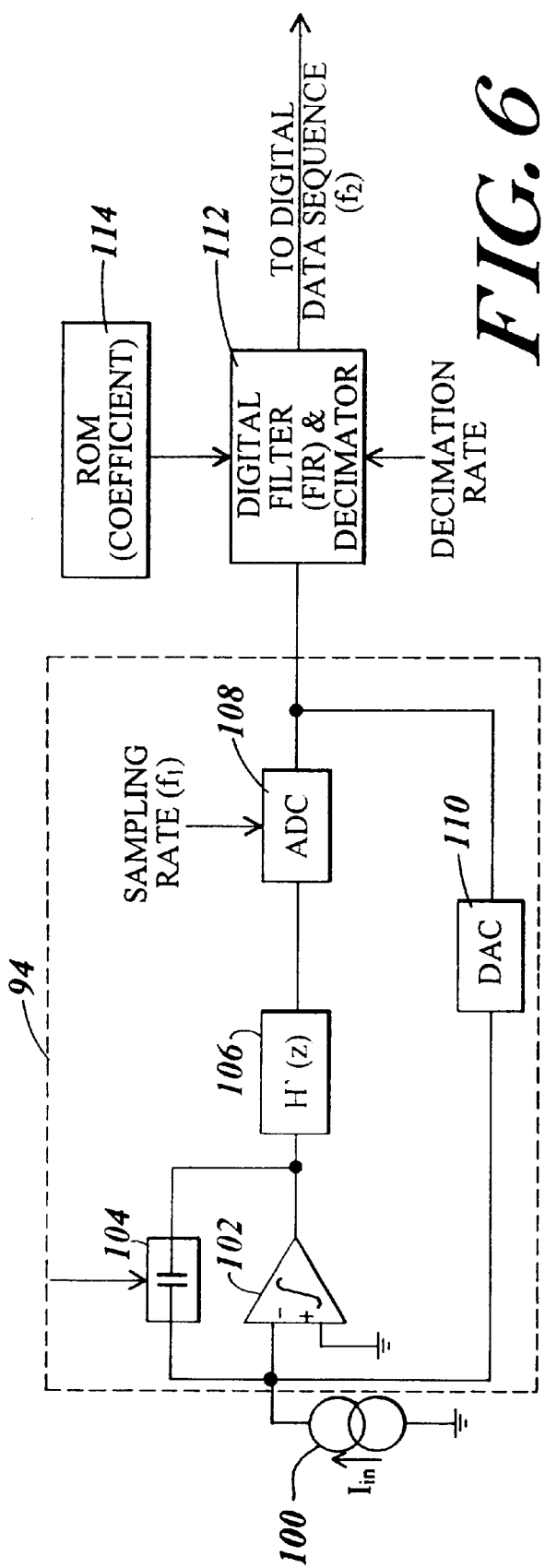
FIG. 6 is a block diagram of the preferred embodiment of delta-sigma A/D converter shown in FIG. 5.

More particularly, referring to FIG. 6 the current input from the detector, represented as a current source 100 is applied directly to the input of the modulator 94. Specifically, the current is applied to the inverting input of an input integrating amplifier 102, the latter having a non-inverting input connected to ground, and an impedance 104 connected in the feedback path between the output and inverting input. The impedance is preferably in the form of a switching capacitor, which provides an impedance as a function of the capacitance value of the capacitor and the frequency at which it is switched. The output of the integrating amplifier 102 is applied to a noise shaping circuit 106, preferably comprising a plurality of integrators as described in connection with FIG. 7, and having a transfer function H(z). The output of the noise-shaping circuit 106 is connected to an input of an A/D converter 108 which digitizes the analog input at a sampling rate designated $f_1$. The output of the converter 108 is applied to the input of a quantizer in the form of a digital to analog (D/A) converter 110, which in turn applies its output signal to the non-inverting input of the integrating amplifier 102 so as to form a feedback loop, as is required of a delta-sigma modulator. The output of the A/D converter 108 is also applied to the input of the data rate decimator and digital filter 112 which reduces the sample rate to $f_2$. The digital filter is preferably a finite impulse response (FIR) filter having predetermined coefficients stored in read only memory (ROM) 114 for setting the taps of the filter.

In CT scanners of the third generation type, the bandwidth of interest is typically between DC (0 Hz) and $f_{INF}$, where $f_{INF}$ typically is between about 100 Hz and 500 Hz. The preferred sampling ratio, R, is set at 128, with the Nyquist rate set to be twice the highest frequency of interest (e.g., 500 Hz). Thus, $f_1$ is preferably set at about 128 KHz, while the decimation rate is set to reduce the data rate output of A/D converter 108 to about 1 KHz ($f_2$). It should be appreciated where $f_{INF}$ is higher, as is the case with some fourth generation CT scanners (where $f_{INF}$ can be as high as 10 kHz), the frequencies can be adjusted to provide the desired result.

The specific implementation of the modulator 94 is shown and described in related application, U.S. application Ser. No. 870,059, filed Apr. 17, 1992 in the name of Charles D. Thompson, and issued Dec. 28, 1993 as U.S. Pat. No. 5,274,375 (the "'375 Patent"). The specific implementation described in the '375 Patent, was derived from the present invention. As described, and reproduced in FIG. 7, an input current signal is provided to the positive input of summing junction 120, the output of which is applied to the input of the first integrator stage 122. The first integrator stage 122 is comparable to the integrating amplifier 102 of FIG. 6. The integrator stage preferably has a gain coefficient of one. The output of integrator stage 122 is applied to the positive input of a second summing junction 124, the output of which is connected to a second integrator stage 126. This second integrator stage 126 also preferably has a gain coefficient of one. The output of the second integrator stage 126 is applied to the input of a third integrator stage 128, the latter preferably having a gain coefficient of 0.2. The output of the third integrator stage 128 is applied to the input of a summing junction 130. The output of the latter is applied to the input of a fourth integrator stage 132 having a coefficient preferably set for 0.2, with the output of the stage 132 being applied to the input of a fifth integrator stage 134. The stage 134 preferably has its gain coefficient set at 0.2. A feedback path, indicated at 136 is provided between the output of the stage 128 and the summing junction 124. A similar feedback path, indicated at 138, is provided between the output of the stage 134 and the summing junction 130. As indicated the feedback coefficient of path 136 is preferably set at 0.0115, while the feedback coefficient of path 138 is preferably set at 0.020. The output of each of the integrator stages 122, 126, 128, 132 and 134 are applied to positive inputs of a summing junction 140 which forms a part of the feedback path of the modulator. The output of each integrator stage 122, 126, 128, 132 and 134 is modified by an attenuation coefficient of 0.95, 0.45, 0.60, 0.45 and 0.15, respectively before being applied to the summing junction, as indicated at 142, 144, 146, 148 and 150. It will be appreciated that as shown, the configuration provided by the stages 126, 128, 132 and 134, and their interconnections and connections to summing junction 140 provide the noise shaping transfer function H(z) referred to at 106 in FIG. 6. Further, while five amplifiers are used to provide a fifth order modulator, other orders can be designed to provided different degrees of resolution. The greater the order of the modulator the better the resolution, but the greater the complexity. It is believed that for satisfactory results at least a second order modulator must be utilized with a fifth order modulator being preferred.

Figure 7:
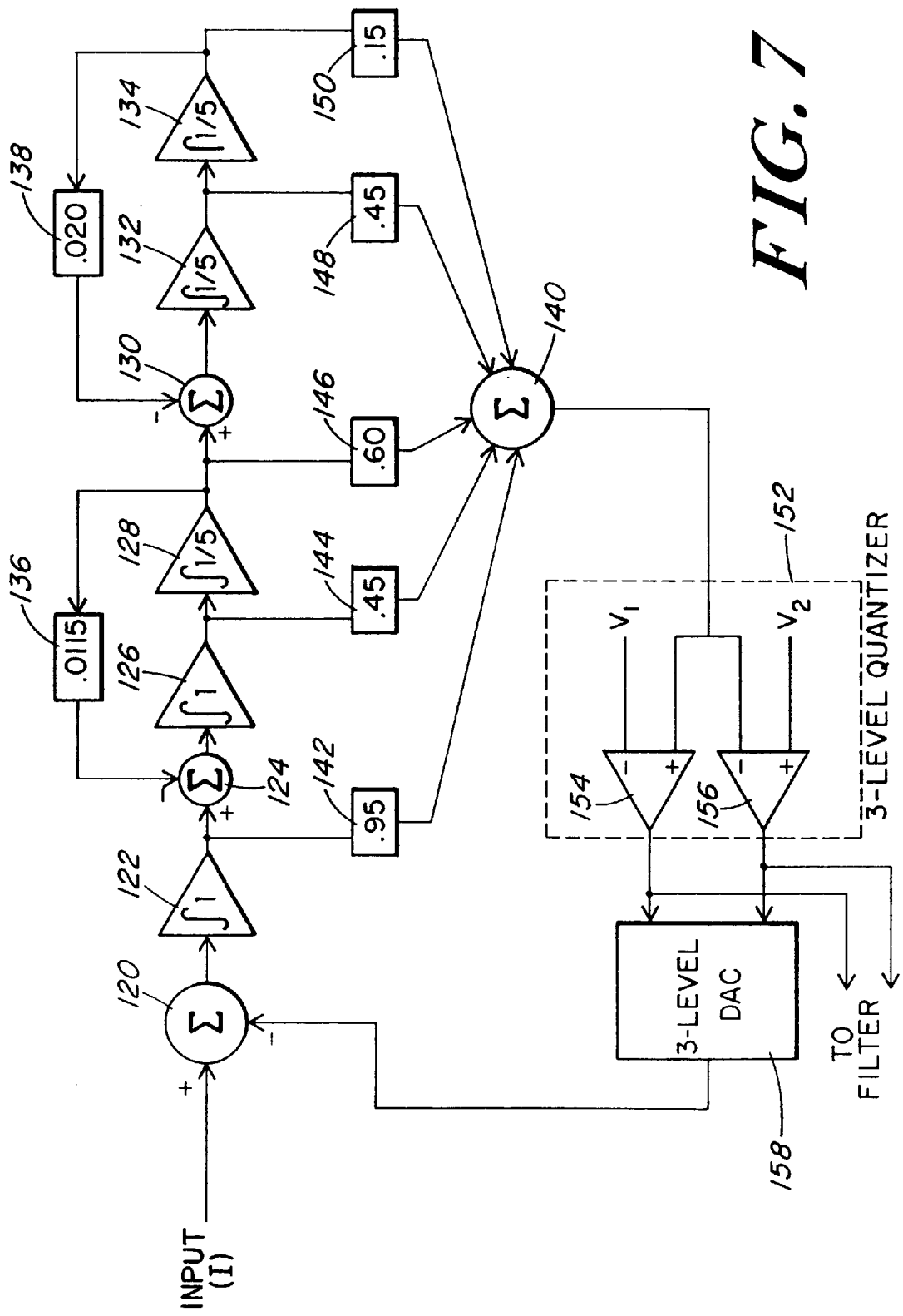
FIG. 7 is a block diagram of the preferred implementation of the delta-sigma modulator shown in FIG. 6.

In FIG. 7, the output of summing junction 140 is applied to the input of a tri-level quantizer 152 comprising two comparators 154 and 156, the outputs of which are connected to the filter 112 (seen in FIG. 6) and to a three level D/A converter (DAC) 158. This three-level D/A converter is operated with normalized DAC feedback levels of −1 and +1 in addition to the third "do nothing" level. The analog full scale input range to the delta-sigma modulator is then normalized to between +1 and −1. These normalized input and feedback levels are used in the simulations described in the '375 Patent.

Figure 9:
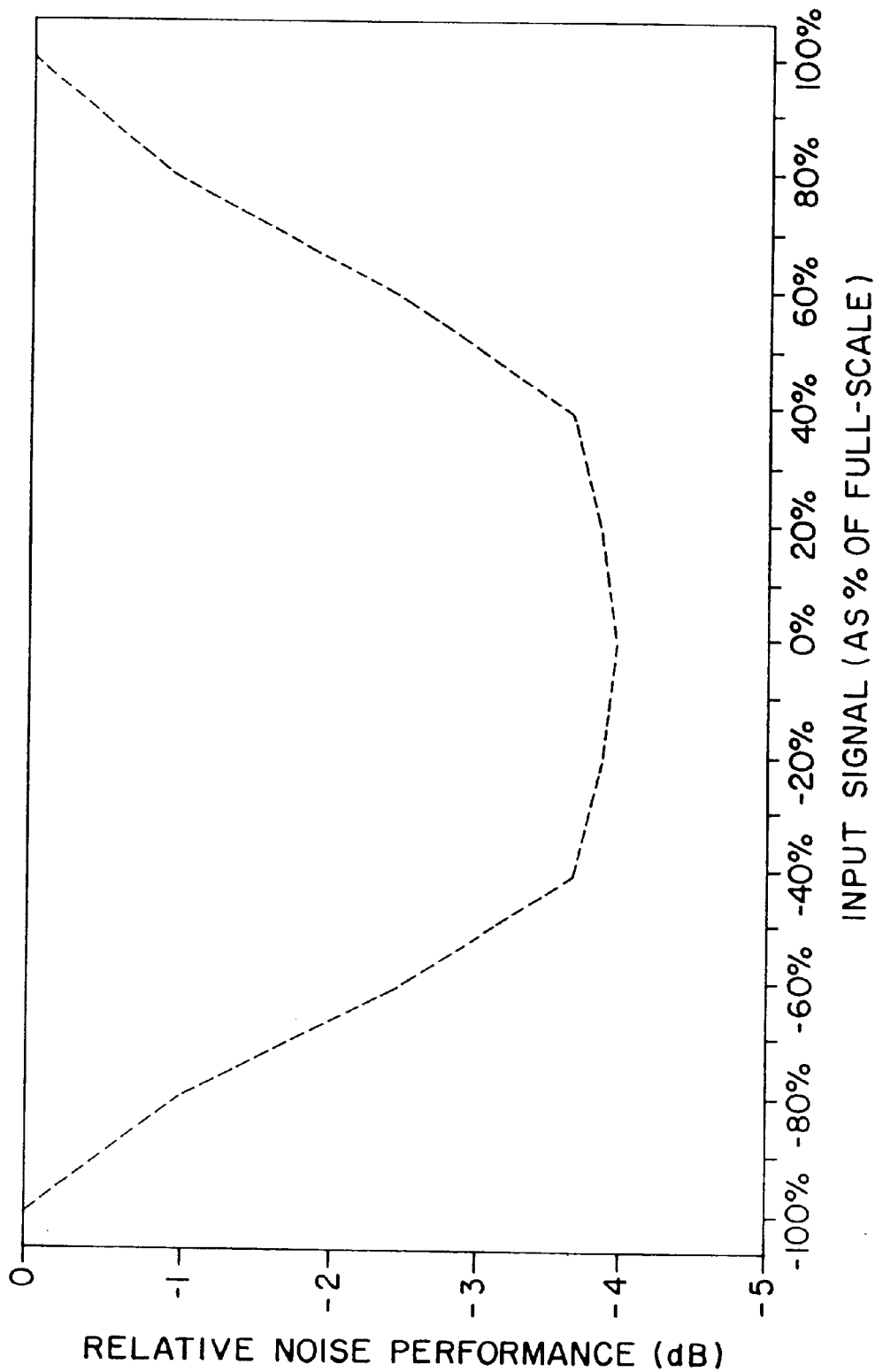
FIG. 9 is a graphical illustration showing a reduction of the electronic noise for one channel of the preferred DAS employing the delta-sigma A/D converter as the input signals get smaller.

Referring to FIG. 9, there is a graphical representation of the electronic noise of the modulator 94 as a function of input signal level, the latter ranging from full positive scale to full negative scale, with the relative noise performance being plotted on the vertical axis. This graph illustrates the condition when the quantizer thresholds for the comparators are optimized for electronic noise. As shown the electronic noise is inversely related to the level of input signal. As a result, because of the 4 bB drop in electronic noise at 0.0 input compared to full scale, the overall S/N ratio of the data signal at low input levels will be improved, which helps compensates for the poorer S/N ratio associated with the relatively small number of photons and their associated noise at low level X-rays, which as previously described is approximately proportional to the square root of the number of photons present.

In addition, the data rate decimator and digital filter 112 of the delta-sigma A/D converter shown in FIG. 6 includes an improved FIR filter designed so as to achieve greater roll off than achieved by the prior art anti-alias, low pass filters, and the digital filter used in the design of the Ribner et al. Patent so as to have improved frequency response characteristics. In particular, a standard FIR filter is used and is designed with 384 taps. The ROM 114 is programmed with 384 coefficients predetermined to provide the desired frequency response. The coefficients are identified in Appendix A, attached hereto and forming a part of this disclosure. The FIR filter should be designed to provide a gentle roll-off at low frequencies from DC to the maximum information frequency of interest, $I_{INF}$ (which for third generation CT scanners can range from 100 Hz to 500 Hz), so as to include the bandwidth of interest, with some substantial attenuation (e.g., −20 dB) at the scanner view rate (i.e., the delta-sigma output sampling rate, $f_2$), and a continuously increasing roll-off rate up to about twice the view rate ($2*f_{VR}$) where the roll-off exceeds −100 dB/octave and the nominal magnitude response is a maximum of −126 dB; beyond this frequency, the magnitude response must remain below −126 dB. The improvement in the frequency response is, however, attained even with excellent time domain performance (maximum spillover of about 4%, as defined by the FIR filter coefficients).

The foregoing delta-sigma A/D converter is thus an improvement over the prior art converters described. The current input, oversampled, delta-sigma A/D converter is responsive to the low level current inputs received from detectors of a CT scanner and can be completely implemented in IC form thereby reducing the overall costs of a CT scanner DAS. A plurality of delta-sigma A/D converters can be used to process a corresponding number of signals received from the detector array of a CT scanner, without the need for analog signal multiplexing. The DAS using delta-sigma A/D converters designed in accordance with the present invention has an improved frequency response with nominal spillover. The unique noise shaping of the delta-sigma A/D converters throughout the dynamic range of the current outputs of CT scanner detectors compensates for the poorer S/N associated with photon detection. The delta-sigma A/D converter is provided with a unique digital filter transfer function, with finite impulse response (FIR) filter characteristics, optimized for CT-DAS applications and having excellent characteristics in the frequency domain and the time domain. The delta-sigma A/D converter of the present invention provides a best estimating, optimum, transient response filter which is an improvement over the filter design described in U.S. Pat. No. 4,547,893 issued to Gordon. Finally, by having the front end of each channel disposed within a control loop, the improved delta-sigma A/D converter provides improved DC stability for use in a DAS of a CT scanner.

Other modifications and implementations will occur to those skilled in the art without departing from the spirit and the scope of the invention as claimed. Accordingly, the above description is not intended to limit the invention except as indicated in the following claims.

What is claimed is:

1. An improved oversampling, delta-sigma A/D converter comprising:
   converter input means for receiving an analog information input current, and converter output means for providing a digital output signal at a predetermined word rate;
   a delta-sigma modulator for receiving an analog information signal as a function of said analog information input current, said modulator comprising:
   (a) modulator input means coupled to said converter input means,
   (b) modulator output means for providing an intermediate digital signal representative of said analog information input current,
   (c) an input integrating amplifier for generating an integrated output signal as a function of the input current,
   (d) means for noise shaping the integrated output signal so as to provide an analog noise shaped signal;
   (e) means for converting the analog noise shaped signal to said intermediate digital signal as a function of the analog filtered signal at a sampling rate of $f_1$; and
   (f) feedback digital-to-analog signal converter means for generating an analog feedback signal as a function of said intermediate digital signal and applying said analog feedback signal to said modulator input means; and
   means for decimating the data rate of and for filtering said intermediate digital signal so as to generate said digital output signal at a word rate $f_2$.

2. A converter according to claim 1, wherein said means for noise shaping the integrated output signal includes (i) at least one additional integrating amplifier connected between the output of said input integrating amplifier and the modulator output means, for providing a second integrated output signal, (ii) means for weighting the integrated output signals of said integrating amplifiers so as to generate corresponding weighted integrated output signals, (iii) means for summing said weighted integrated output signals so as to generate a summed signal, and (iv) means for generating said intermediate digital signal as a function of said summed signal.

3. A converter according to claim 1, wherein said modulator is a fifth order modulator.

4. A CT scanner comprising a source of X-rays, an array of detectors for detecting X-rays emitted by said source and received by said detectors, and a data acquisition system for processing signals generated by said detectors, said data acquisition system comprising a plurality of oversampling delta-sigma A/D converters, each of said delta-sigma converters comprising:
   converter input means for receiving an analog information input current, and converter output means for providing a digital output signal at a predetermined word rate;
   a delta-sigma modulator for receiving an analog information signal as a function of said analog information input current, said modulator comprising
   (a) modulator input means coupled to said converter input means,
   (b) modulator output means for providing an intermediate digital signal representative of said analog information input current,
   (c) an input integrating amplifier for generating an integrated output signal as a function of the input current,
   (d) means for noise shaping the integrated output signal so as to provide an analog noise shaped signal;
   (e) means for converting the analog noise shaped signal to said intermediate digital signal as a function of the analog filtered signal at a sampling rate of $f_1$; and
   (f) feedback digital-to-analog converter means for generating an analog feedback signal as a function of said intermediate digital signal and applying said analog feedback signal to said modulator input means; and
   means for decimating the data rate of and for filtering said intermediate digital signal so as to generate said digital output signal at a word rate $f_2$.

5. A scanner according to claim 4, wherein said means for noise shaping the integrated output signal includes (i) at least one additional integrating amplifier connected between the output of said input integrating amplifier and the modulator output means, for providing a second integrated output signal, (ii) means for weighting the integrated output signals of said integrating amplifiers so as to generate corresponding weighted integrated output signals, (iii) means for summing said weighted integrated output signals so as to generate a summed signal, and (iv) means for generating said intermediate digital signal as a function of said summed signal.

6. A scanner according to claim 4, wherein said modulator is a fifth order modulator.

7. A CT scanner comprising:
   a plurality of detectors, each detector providing a relatively low level analog output current signal as a function of the amount of X-ray photons detected by said detector during a predetermined sampling time;
   a delta-sigma A/D converter including a delta-sigma modulator having a loop and an integrating amplifier dispose within the loop of the modulator so that the input of the modulator can be connected to receive a relatively low level input current signal as a function of the amount of X-ray photons detected by a detector during a predetermined sampling time so as to eliminate the need for a transimpedance preamplifier to preprocess the analog output current signal.

8. A CT scanner according to claim 7, wherein the modulator is an integrated circuit, and the analog output current signal of at least one detector is applied to the input of the modulator.

9. A CT scanner according to claim 7, wherein the converter further includes noise shaping characteristics to improve frequency response with minimal spillover.

10. A CT scanner according to claim 7, wherein the converter further includes a digital filter for filtering the output of the modulator.

11. A CT scanner according to claim 10, wherein the digital filter includes a digital filter transfer function optimized for CT-DAS applications.

12. A CT scanner according to claim 11, wherein the digital filter transfer function includes finite impulse response (FIR) filter characteristics.

13. A method of processing an analog output current signal of a detector of a CT scanner, comprising:

applying a relatively low level input current signal as a function of the X-ray photons detected by a detector of a CT scanner during a predetermined sampling period to an input of a delta-sigma A/D converter including a delta-sigma modulator having a loop and an integrating amplifier dispose within the loop of the modulator so that the input of the modulator is connected to receive the relatively low level input current signal during a predetermined sampling time so as to eliminate the need for a transimpedance preamplifier to preprocess the analog output current signal of the detector.

14. A method according to claim 13, wherein the step of applying the relatively low level input current signal as a function of the X-ray photons includes applying the low level input current signal to the input of a delta-sigma modulator, wherein the modulator is formed as a part of an integrated circuit.

15. A method according to claim 13, wherein the converter further includes noise shaping characteristics to improve frequency response with minimal spillover.

16. A method according to claim 13, wherein the converter further includes a digital filter for filtering the output of the modulator.

17. A method of claim 16, wherein the digital filter includes a digital filter transfer function optimized for CT-DAS applications.

18. A method according to claim 17, wherein the digital filter transfer function includes finite impulse response (FIR) filter characteristics.

19. A method of oversampling an analog information input current signal with an oversampling, delta-sigma A/D converter, and generating a digital signal representative of the input current signal, comprising:

receiving the analog information input current signal at an input to the converter;

generating an integrated output signal as a function of the analog information input current signal including:

(1) noise shaping the integrated output signal so as to provide an analog noise shaped signal;

(2) converting the analog noise shaped signal to an intermediate digital signal as a function of an analog filtered signal at a sampling rate of $f_1$; and (3) generating an analog feedback signal as a function of said intermediate digital signal and applying the analog feedback signal to the input of the modulator such that the integrated output signal is a function of the analog information input current signal and the analog feedback signal; and decimating the data rate of and filtering the intermediate digital signal so as to generate the digital output signal at a word rate $f_2$.

20. A method of oversampling an analog current input information signal with a delta-sigma A/D converter, comprising:

receiving an analog information signal as a function of said analog information input current with a delta-sigma oversampling, A/D converter, comprising:

(a) providing an intermediate digital signal representative of said analog information input current, (b) generating an integrated output signal as a function of the input current, (c) noise shaping the integrated output signal so as to provide an analog noise shaped signal;

(d) converting the analog noise shaped signal to said intermediate digital signal as a function of the analog filtered signal at a sampling rate of $f_1$; and (e) generating an analog feedback signal as a function of said intermediate digital signal and applying said analog feedback signal to a modulator input; and decimating the data rate of and for filtering said intermediate digital signal so as to generate said digital output signal at a word rate $f_2$.

21. A method according to claim 20, wherein noise shaping the integrated output signal includes, providing a second integrated output signal, weighting the first and second integrated output signals of said integrating amplifiers so as to generate corresponding weighted integrated output signals, summing said weighted integrated output signals so as to generate a summed signal, and (iv) generating said intermediate digital signal as a function of said summed signal.

* * * * *